United States Patent [19]

Shimizu et al.

[11] Patent Number: 5,081,067
[45] Date of Patent: Jan. 14, 1992

[54] CERAMIC PACKAGE TYPE SEMICONDUCTOR DEVICE AND METHOD OF ASSEMBLING THE SAME

[75] Inventors: Nobutaka Shimizu; Takehisa Tsujimura, both of Kawasaki; Masahiro Sugimoto, Yokosuka; Shigeki Harada, Musashino, all of Japan

[73] Assignee: Fujitsu Limited, Kawasaki, Japan

[21] Appl. No.: 698,030

[22] Filed: May 10, 1991

Related U.S. Application Data

[62] Division of Ser. No. 477,404, Feb. 9, 1990.

[30] Foreign Application Priority Data

Feb. 10, 1989 [JP] Japan .................. 1-032339
Mar. 17, 1989 [JP] Japan .................. 1-066771

[51] Int. Cl.$^5$ ............................................. H01L 21/60
[52] U.S. Cl. ............................ 437/209; 437/215; 437/216; 437/217; 437/218; 357/74; 357/80; 361/381
[58] Field of Search ............... 437/209, 218, 217, 216, 437/215; 357/80, 81, 74; 361/381

[56] References Cited

U.S. PATENT DOCUMENTS

| | | | |
|---|---|---|---|
| 4,023,562 | 5/1977 | Hynecek et al. | 437/215 |
| 4,177,480 | 12/1979 | Hintzmann et al. | 437/217 |
| 4,523,371 | 6/1985 | Wakashima | 437/215 |
| 4,761,518 | 8/1988 | Butt et al. | 437/217 |
| 4,769,345 | 9/1988 | Butt et al. | 437/217 |
| 4,873,615 | 10/1989 | Grabbe | 361/386 |
| 4,878,108 | 10/1989 | Phelps, Jr. et al. | 357/81 |
| 4,908,696 | 3/1990 | Ishihara et al. | 357/81 |
| 4,926,242 | 5/1990 | Itoh et al. | 357/74 |
| 4,939,570 | 7/1990 | Bickford et al. | 357/74 |
| 4,980,753 | 12/1990 | Punaway et al. | 357/80 |

FOREIGN PATENT DOCUMENTS

| | | | |
|---|---|---|---|
| 0137385 | 4/1985 | European Pat. Off. | 357/81 |
| 60-213048 | 10/1985 | Japan | 437/217 |
| 62-21251 | 1/1987 | Japan | 357/74 |

Primary Examiner—Brian E. Hearn
Assistant Examiner—Kevin M. Picardat
Attorney, Agent, or Firm—Armstrong, Nikaido, Marmelstein, Kubovcik & Murray

[57] ABSTRACT

A ceramic package type semiconductor device comprising: a ceramic substrate having a wiring pattern layer formed on a top surface thereof; at least one semiconductor element mounted on the ceramic substrate with a top face thereof facing downward and electrically connected to the wiring patttern layer; a metal cap having at least one through-hole corresponding to an external size of the semiconductor element and an end portion thereof soldered to the top surface of the ceramic substrate, so that a top surface of the metal cap and a bottom surface of the semiconductor element fitting into the through-hole form a flat plane: and a heatsink member comprising a plate portion which is soldered to the flat plane of the metal cap and the semiconductor element to complete a hermetic sealing of the semiconductor element.

22 Claims, 8 Drawing Sheets

CERAMIC PACKAGE TYPE SEMICONDUCTOR DEVICE AND METHOD OF ASSEMBLING THE SAME

This is a division of application Ser. No. 477,404 filed Feb. 9, 1990.

BACKGROUND OF THE INVENTION

1. Field of the Invention

The present invention relates to a packaged semiconductor device, and more particularly, to a hermetically sealed ceramic package type semiconductor device and a method of assembling the same.

The number of components (active elements) of a semiconductor chip (IC or LSI chip) continues to increase, and accordingly, the consumption of electric power as the semiconductor chip is increased, and thus more heat is generated thereby. To remove this heat from the semiconductor chip, a ceramic package is provided with a heatsink member (a heatsink plate or a heatsink plate with a heat dissipation fin).

2. Description of the Related Art

Figure 1:
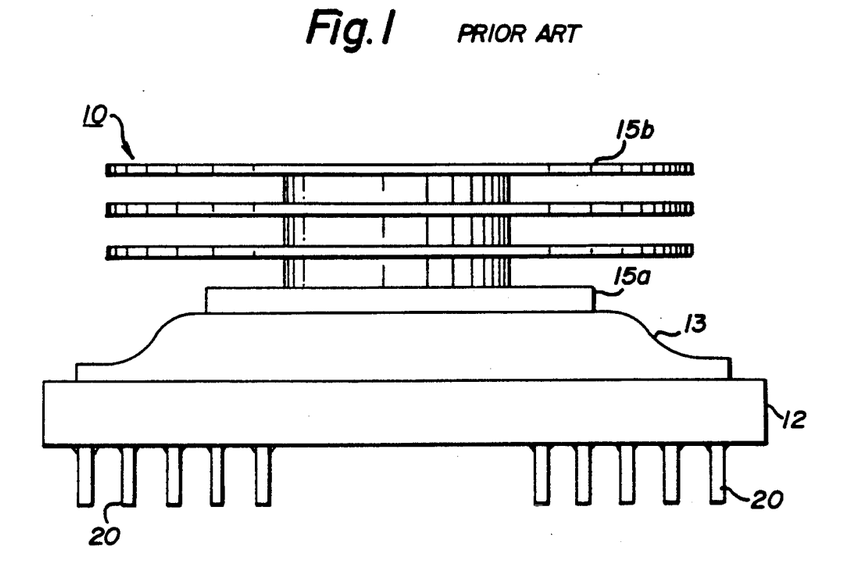
FIG. 1 is a front view of a ceramic package type semiconductor device.
Figure 2:
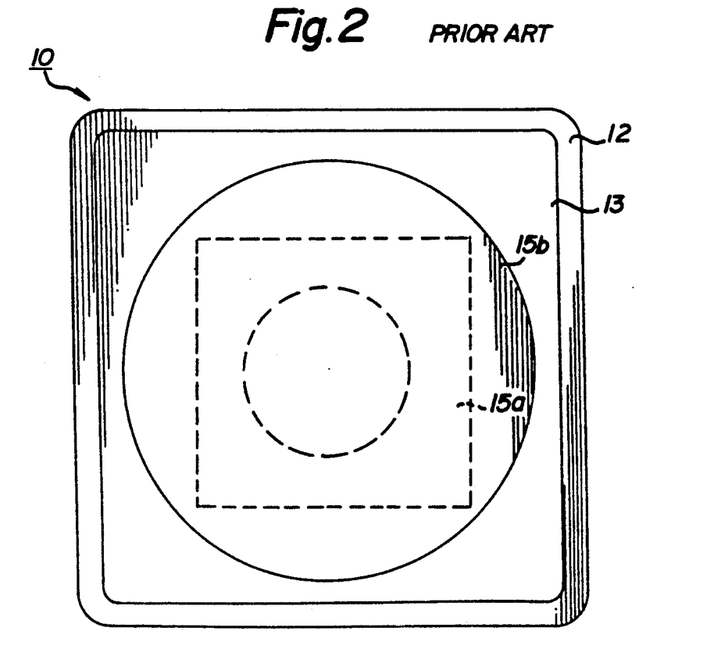
FIG. 2 is a plan view of the device of FIG. 1.
Figure 3:
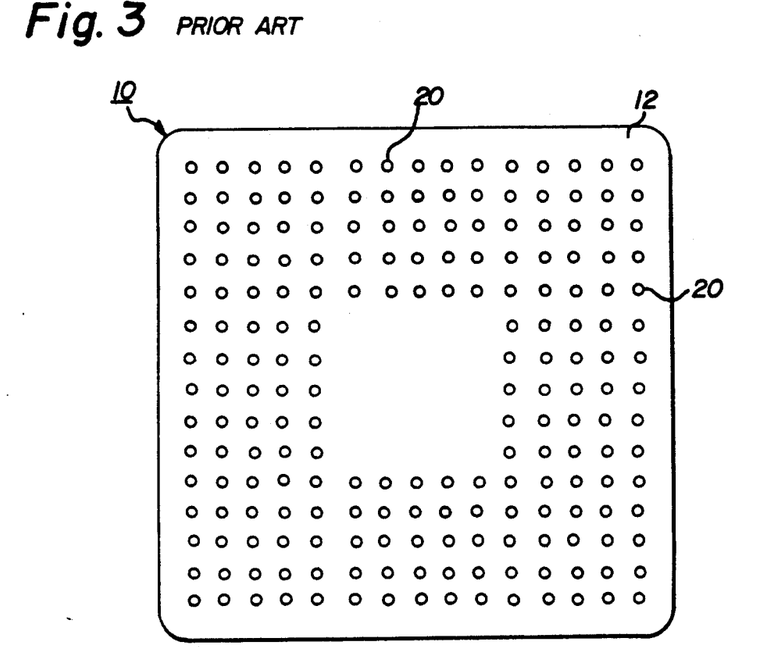
FIG. 3 is a bottom view of the device of FIG. 1.
Figure 4:
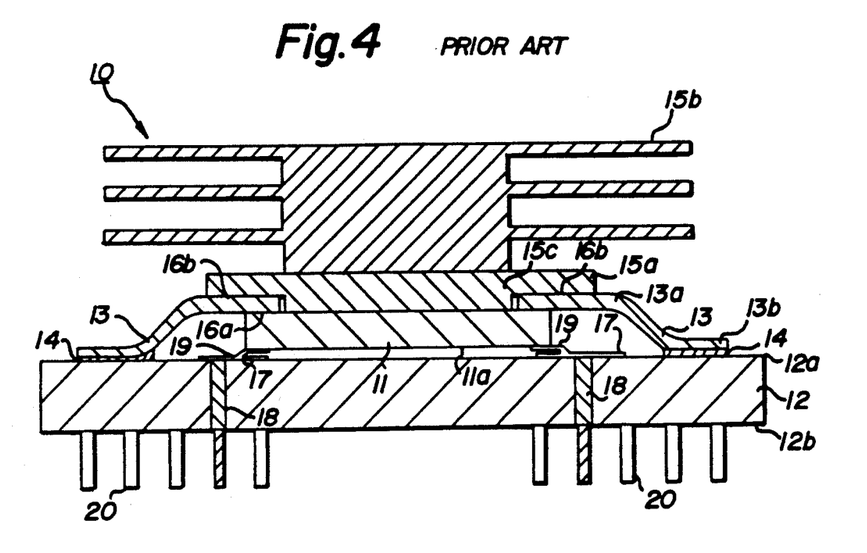
FIG. 4 is a sectional view of the device of FIG. 1.
Figure 5:
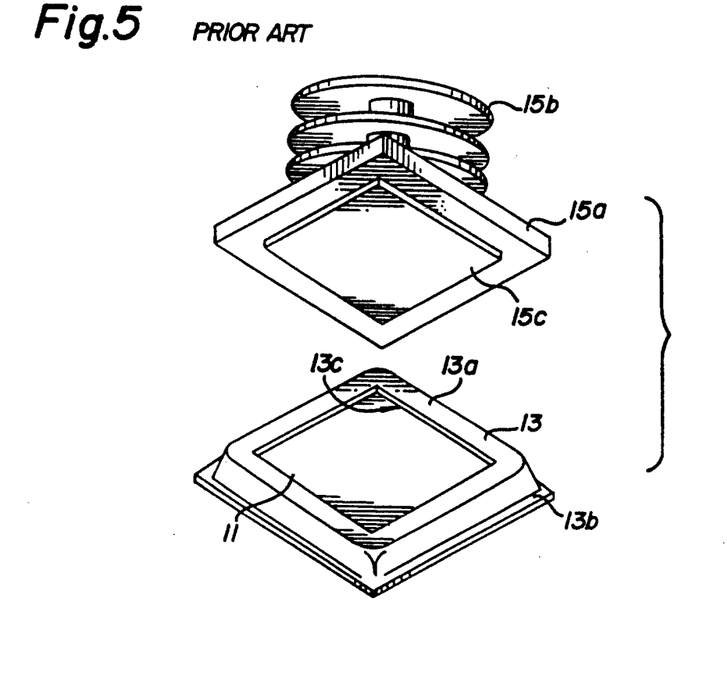
FIG. 5 is a partial perspective view of the device of FIG. 1, except for a ceramic substrate.
Figure 6:
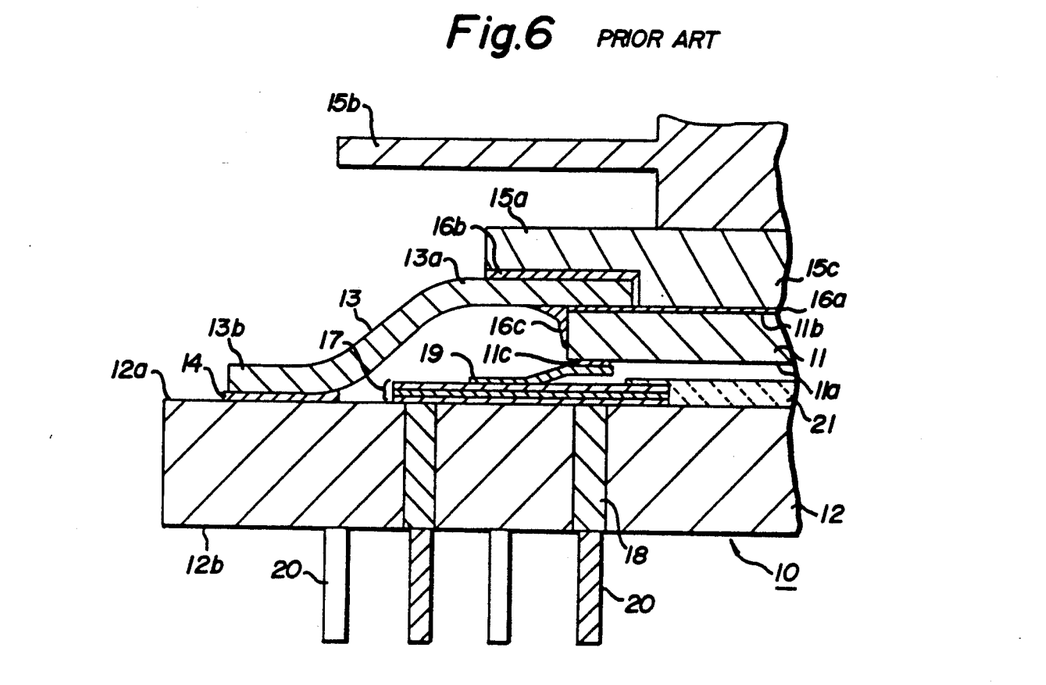
FIG. 6 is a partial enlarged sectional view of the device of FIG. 1.

A known ceramic package type semiconductor device comprises a ceramic substrate, a semiconductor chip mounted on the substrate with a top face thereof facing downward, a metal cap covering the chip and having a through-hole at a top portion thereof, and a heatsink member bonded to a bottom surface of the chip through the through-hole with a solder. Such a semiconductor device and variations thereof have been proposed in U.S. Pat. Nos. 4,698,663 and 4,742,024, which are based on Japanese Unexamined Patent Publication (Kokai, JP-A) No. 63-73650, and a ceramic package type semiconductor device similar to the proposed semiconductor device is illustrated in FIGS. 1 to 6. FIG. 1 is a front view, FIG. 2 is a plan view, FIG. 3 is a bottom view, and FIG. 4 is a sectional view of the semiconductor device. FIG. 5 is a partial perspective view of the semiconductor device except for a ceramic substrate, and FIG. 6 is a partial enlarged section view of the semiconductor device. The semiconductor device 10 comprises a semiconductor chip (element) 11, a ceramic substrate 12 with pins 20, a metal cap 13, heatsink plate 15a, and a heat dissipation fin 15b. In this case, the ceramic substrate 12 is provided with many pins 20 (FIG. 3) soldered to the bottom surface 12b thereof, i.e., is a pin-grid array (PGA). The ceramic substrate 12 is made of AlN, SiC, Al$_2$O$_3$ or the like, and is provided with a wiring pattern layer 17 on the top surface 12a thereof. The top surface 12a and the layer 17 are covered with a polyimide layer 21, to prevent α-ray errors (FIGS. 4 and 6). The ceramic substrate 12 is provided with interconnections 18 which connect the wiring patter layer 17 and the pins 20 and are made of a refractory metal (e.g., tungsten: W) filling via holes.

The semiconductor chip 11 is provided with solder bumps 11c on the top surface 11a thereof (FIGS. 4 and 6) and microleads 19 bonded to the bumps 11c, respectively, by a tape automated bonding (TAB) processing method. Note the semiconductor chip 11 may be a flip-chip having solder bumps without microleads. The semiconductor chip 11 is mounted on the ceramic substrate 12 by bonding the TAB leads 19 to the wiring pattern layer 17.

The metal cap 13 includes a top flat portion 13a and a flange portion 13b and has a through-hole 13c provided in the top portion 13a and having a rectangular (square) size smaller than the external size of the semiconductor chip 11. The metal cap 13 is made of Fe-Ni-Co alloy (e.g., Kovar), Fe-Ni alloy (e.g., 42 alloy) or the like. To join or bond the heatsink plate 15a to the bottom surface 11b of the semiconductor chip 11, the heatsink plate 15a is provided with a projecting portion 15c which fits in the throughhole 13c and has a thickness corresponding to that of the metal cap 13, as shown in FIGS. 4 to 6. The heatsink plate 15a with the projecting portion 15c is made of Mo, Cu, Cu-W, Al, Al-N, SiC or the like. In this case, the heat dissipation fin 15b of Cu or Al is bonded to the heatsink plate 15a with solder (not shown) and comprises concentric disk fins. The heat dissipation fin 15b is generally coated (plated) with an Ni layer for soldering.

After the mounting of the semiconductor chip 11, a solder frame 14 is put on the top surface 12a of the substrate 12, a solder plate 16a larger than the opening size of the through-hole 13c is placed on the bottom surface 11b of the semiconductor chip 11, the flange portion 13b and the top flat portion 13a of the metal cap 13 are placed on the solder frame 14 and the solder plate 16a, respectively, an additional solder frame 16b is put on the top flat portion 13a, and then the projecting portion 15c of the heatsink plate 15a with the fin 15b is placed on the solder plate 16a through the through-hole 13c. The solder frame 14, solder plate 16a and the additional solder frame 16b are made of the same solder, e.g., Pb-Sn. The thus assembled device is then heated to reflow (melt) the solders 14, 16a and 16b, so that the cap 13 is soldered to the substrate 12 and to the heatsink plate 15a, and simultaneously the semiconductor chip 11 is soldered to the both the cap 13 and the projecting portion 15c, whereby a hermetic sealing of the semiconductor chip is completed.

The additional solder frame 16b is not provided in the above-mentioned U.S. patents.

When the heat treatment for reflowing the solder material is carried out, a portion 16c (FIG. 6) of the solder plate 16a may flow out of a gap between the semiconductor chip 13 and top portion 13a and may drop down on or leach the microleads 19, to thereby cause a short-circuit. If a total thickness of the top portion 13a and additional solder frame 16b is larger than the thickness of the projecting portion 15c, and a space is formed between the projection portion 15c and the solder plate 16a during the heat treatment, the solder plate 16a is too short to completely fill the gap between the projection portion 15c and the bottom surface 11b of the semiconductor chip 11. Accordingly, the whole surface of the projection portion 15c comes into contact with the reflowed solder, and thus the heat transfer effect is reduced. A space exists between the side surface of the top portion 13a of the cap 13 and side surface of the projection portion 15c wherein a preformed solder member is not arranged, and during the heat treatment, a gas flows outwardly from that space to form voids in the reflowed solder layers 16b and 16c, whereby the bonding strength and water vapor barrier properties of the solder layers 16b and 16c are lowered. As shown in FIGS. 4 to 6, the external size of the projection portion 15c is smaller than that of the semiconductor chip 11, and the top portion 13a of the cap 13 comes into contact with the semiconductor chip 11, and since the metal (e.g., Kovar) of the cap 13 has a smaller heat transfer rate than that of the heatsink plate 15a, the top portion 13a prevents the dissipation of heat from the heating chip 11. Furthermore, during the operation of the semiconductor device 10, the semiconductor chip 11 generates heat to thermally expand the chip itself, the heatsink plate 15a including the projection portion 15c, and the cap 13, and since the heatsink plate 15a is bonded to the top portion 13a with the solder frame (reflowed layer) 16b, the projecting portion 15c can be thermally expanded downward to press against the semiconductor chip 11. This pressure on the chip 11 repeatedly imposes a stress on the microleads (TAB leads) 19, for a long time, and accordingly, the microleads 19 are often broken.

SUMMARY OF THE INVENTION

An object of the present invention is to increase heat transfer efficiency of a heatsink member bonded to a semiconductor chip (element) in a ceramic package type semiconductor device.

Another object of the present invention is to improve a soldering sealing and the reliability of a hermetic sealing of the ceramic package type semiconductor device.

Another object of the present invention is to prevent a breaking of microleads (TAB leads) of a semiconductor chip (element), i.e., to prolong the working life of the microleads.

Still another object of the present invention is to provide an improved ceramic package type semiconductor device with a heatsink member, and a method of assembling the same.

The above-mentioned objects and other objects of the present invention are attained by providing a semiconductor device comprising: a ceramic substrate having a wiring pattern layer formed on a top surface thereof; at least one semiconductor element mounted on the ceramic substrate with a top face thereof facing downward and electrically connected to the wiring pattern layer; a metal cap having at least one through-hole corresponding to an external size of the semiconductor element and an end portion thereof soldered to the top surface of the ceramic substrate, so that a top surface of the metal cap and a bottom surface of the semiconductor element fitting into the through-hole form a flat plane: and a heatsink member comprising a plate portion which is soldered to the flat plane of the metal cap and the semiconductor element to complete a hermetic sealing of the semiconductor element.

According to the present invention, the top surface of the cap and the bottom surface of the semiconductor element (chip) are arranged at almost the same level, which eliminates the need to form a projecting portion of a conventional heatsink plate and enables a heatsink plate with a flat bottom surface to be bonded to a flat plane of the cap and the element with a solder. Therefore, the whole bottom surface of the semiconductor element comes into contact with the heatsink plate through the soldering layer, to increase the heat dissipation (heat transfer). Since a sealing by solder is performed at a flat face, to flow out of the solder from a bonding portion is reduced. Before setting a solder plate and the heatsink plate on both the cap and the element, it is easy to perform a visual inspection on a degree of flatness of the top surface of the cap and the bottom surface of the semiconductor element, and thus reduce the failure rate of the sealing. Furthermore, when the semiconductor element repeatedly generates heat while in operation, since the heatsink plate is thermally expanded upward from the flat plane and the cap supports the heatsink plate, the semiconductor element is placed under stress by the heatsink plate, and thus breaking of the microleads is remarkably reduced.

The ceramic package type semiconductor device according to the present invention is assembled by the steps of: mounting at least a semiconductor element on a ceramic substrate with a top face thereof facing downward and electrically connected to a wiring pattern layer of the ceramic substrate; placing a solder frame on the ceramic substrate at a peripheral region of the substrate; placing a metal cap which has at least one through-hole corresponding to an external size of the semiconductor element, on the solder frame, to fit the semiconductor element into the through-hole and to form a flat plane with the top surface of the metal cap and the bottom surface of the semiconductor element; heating the thus assembled device to solder the metal cap to the ceramic substrate; placing a solder plate on the flat plane of the top surface of the metal cap and the bottom surface of the semiconductor element; placing a plate portion of a heatsink member on the solder plate; and heating the assembled device to solder the plate portion to the metal cap and the semiconductor element, whereby a hermetic sealing of the semiconductor element is completed.

Where the solder frame and the solder plate are made of the same solder material, the former heat treatment can be omitted.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 7:
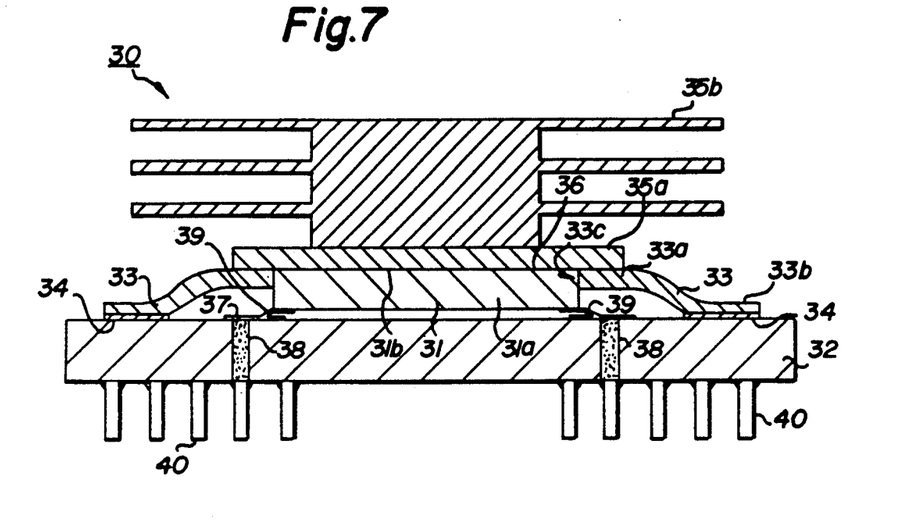
FIG. 7 is a sectional view of a ceramic package type semiconductor device according to a first embodiment of the present invention.
Figure 8:
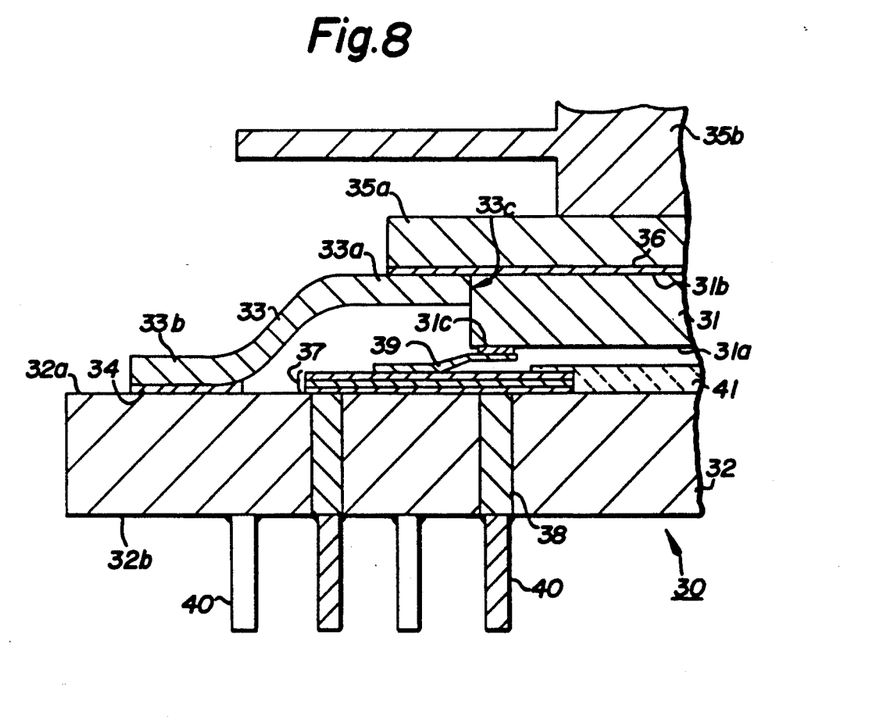
FIG. 8 is a partial enlarged sectional view of the device of FIG. 7.
Figure 9:
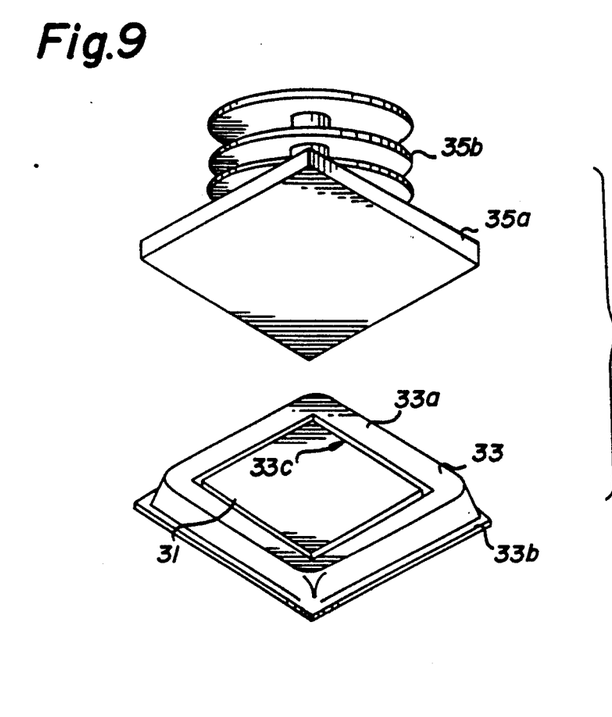
FIG. 9 is a partial perspective view of the device of FIG. 7, except for a ceramic substrate.

Referring to FIGS. 7, 8 and 9, a ceramic package type semiconductor device according to a first embodiment of the present invention is now explained.

For example, the semiconductor device 30 comprises a semiconductor chip 31 of a Si IC element, a ceramic substrate 32 of AlN with pins 40 (AlN PGA), a metal cap 33 of Kovar, and a heatsink member consisting of a heatsink plate 35a of Al-Si alloy and a heat dissipation fin 35b of Al. According to the present invention, the metal cap has a through-hole 33c at a top flat portion 33a thereof, the size of the through-hole 33c corresponding to or being slightly larger than an external size of the semiconductor chip 31. The metal cap 33 and the chip 32 are arranged (mounted on the top surface 32a of the substrate 32) so as to form a flat face of a top surface of the top portion 33a and a bottom surface 31b of the chip 31. Therefore, the heatsink plate 35a has a flat bottom surface without a projecting portion, as shown in FIG. 9.

The AlN ceramic substrate 32 is provided with a wiring pattern layer 37 having a multilayer structure consisting of conductive layers and insulating layers laminated one on the other, on the top surface 32a thereof. For example, a first conductive layer on the ceramic substrate is made of Ti/Mo/Ni, a second conductive layer and further conductive layer (if necessary) are made of Cr(Ti)/Cu/Ni/Au, and the insulating layers are made of polyimide. The pattern layer 37 and the top surface 32a are coated with a polyimide layer 41 (FIG. 8), except for contact regions and a soldering region for the cap 33. Interconnections 38 are made of refractory metal (W or Mo) filling via holes in the ceramic substrate 32 and connecting the wiring pattern layer 37 and the pins 40, respectively. The pins 40 are fixed to the interconnections 38 by soldering on the bottom surface 32b of the substrate 32. The ceramic substrate 32 may be made of alumina ($Al_2O_3$), silicon carbide (SiC), mullite or the like.

The semiconductor chip 31 is provided with solder bumps (bump electrodes) 31c (FIG. 8) on the top surface 31a thereof, and the bottom surface 31b is coated with a Ti sputtering layer and then an Au sputtering layer (not shown), for soldering in a conventional manner. The semiconductor chip 31 has microleads 39 bonded to the bumps 31c, respectively, by a TAB processing method, and the microleads 39 are connected to the wiring pattern layer 37 by soldering in a mounting process. It is possible to use a flip-chip having solder bumps and no microleads as the semiconductor chip 31. Furthermore, it is possible to use a compound semiconductor (e.g., GaAs) chip as the semiconductor chip 31.

The metal cap 33 includes the top flat portion 33a and a flange portion 33b and has the through-hole 33c. The metal cap 33 may be made of Fe-Ni alloy (e.g., 42 alloy) or the like, and is produced by deforming a portion of a metal (Kovar) hoop to form a square projection, piercing the projection to form the through-hole 33c, blanking the hoop to form a predetermined cap shape, and plating the cap with a Ni layer. Preferably, the metal cap 33 is plated with the Ni layer having a thickness of 2 μm or more, is annealed at 550° to 800° C. under a hydrogen ($H_2$) atmosphere, and is then plated with a gold (Au) layer having a thickness of 0.1 to 1.0 μm, in particular, 0.3 to 0.7 μm. When Pb-Sn solder is used for the metal cap 33, the Au plating layer deposited on the Ni plating layer improves the flowability of the Pb-Sn solder, since the Au is soluble in the Pb-Sn solder melt, and then in a cooling step, Au-Pb and Au-Sn eutectics occur. If the amount of the dissolved Au is too large, however, the amounts of Au-Pb and Au-Sn eutectics are increased to form undesirable alloy segregations and thus lower the reliability of the sealing. According to circumstances, the metal cap 33 of Kovar or 42 alloy need not be coated with a plating layer, but the height of the cap 33 and the size of the through-hole 33c must be accurately determined. When the Si semiconductor chip 31 has a square shape with 16 mm sides, the through-hole 33c also has a square shape with 16.20 mm sides, and thus the chip 31 can be fitted (inserted) in the through-hole 33c.

In this case, the heatsink means, consists of the heatsink plate 35 having a square shape with 20 mm sides and round corners, and made of AlSi (Al : Si=60 wt % : 40 wt %), and the heat dissipation fin 35b, which has concentric disk portions and is made of Al, which is light and has a good thermal conductivity. The heatsink plate 35a and the fin 35b are directly joined by a friction welding method. The heatsink means is produced by preparing a cylindrical rod of the AlSi alloy and a cylindrical rod of Al, joining the AlSi rod and the Al rod by friction welding, machining (lathing) the joined cylindrical rod to form a member consisting of a round core portion and concentric disk portions, and machining the AlSi disk portion (having a thickness of 1 mm) into a square shape, as shown in FIG. 9. The friction welding forms an uniform joined layer having a thickness of about 1 mm at the interface thereof. The joining strength of the friction welding is 29 kg/mm$^2$, which is higher than the bonding strength of a Pb-Ag solder (e.g., 20 kg/mm$^2$ of Pb-Ag solder). The obtained heatsink member is coated with a Ni plating layer having a thickness of 5 to 7 μm, to facilitate soldering and prevent corrosion.

The ceramic package type semiconductor device 30 is assembled in the following manner.

First, the semiconductor chip 31 is mounted on the AlN ceramic substrate 32 by bonding the microleads 39 to the wiring pattern layer 37, and then a solder frame 34 made of Au-Sn alloy (Au : Sn=80 wt % :20 wt %), is placed on the top surface 32a of the AlN ceramic substrate 32. The shape of the solder frame 34 corresponds to the shape of the flange portion 33b of the metal cap 33. The metal cap 33 is located so that the semiconductor chip 31 can be fitted into the through-hole 33c and the flange portion 33b placed on the solder frame 34. Then a heat treatment for reflowing the Au-Sn solder frame 34 is preformed, to solder (bond) the cap 33 to the substrate 32, and when the soldering is completed, the tip flat surface of the top portion 33a of the cap 33 and the bottom surface 31b of the chip 31 from a flat plane, i.e., the level of the top flat surface is almost the same as that of the bottom surface 31b.

Next, a solder plate (having a thickness of 50 to 70 μm) 36, which is made of Pb-Sn alloy and having the same (square) shape as that of the heatsink plate 35a, is placed on the top flat portion 33a and the whole bottom surface 31b, and the heatsink plate 35a of the produced heatsink member is then put on the solder plate 36, to sandwich the solder plate 36 between the flat bottom of the heatsink plate 35a and the formed flat plane.

Finally, the thus assembled device is heated to reflow (melt) the solder plate 36, to thereby solder (bond) the heatsink plate 35a to both the top flat portion 33a of the cap 33 and the bottom surface 31a of the chip 31, whereby a hermetic sealing with very high reliability of the semiconductor device 30 is completed. The melting point of the Au-Sn solder is higher than that of the Pb-Sn solder, and the heating temperature for soldering the Pb-Sn solder plate is lower than the melting point of the Au-Sn solder.

Figure 10:
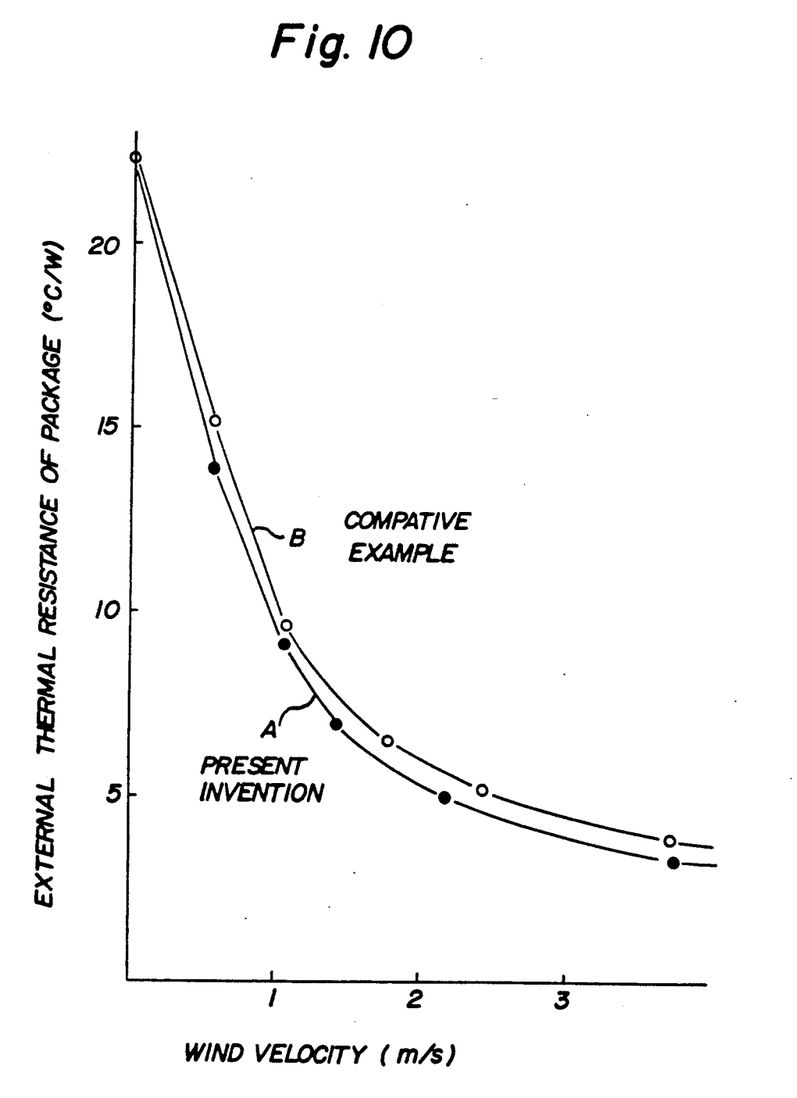
FIG. 10 is a graph showing a relationship between a thermal resistance of a package and a wind velocity for cooling.

To measure a thermal resistance of the assembled package including the heatsink member, a Si semiconductor heating chip having the same size (a square shape with 16 mm sides) as that of the semiconductor IC chip 31, and in which a diffused resistance of a heating source and a PN junction diode of a thermal sensitive element are formed, is mounted instead of the IC chip 31. The measured data of the package is indicated by a curve A in FIG. 10, in which the abscissa axis indicates a wind velocity and the ordinate axis indicates a thermal resistance of the package. A wind is blown onto the device in a direction parallel to a board to which the device is mounted. The heat resistance is a difference between a package (heatsink member) temperature and an ambient temperature per a unit of electric power (1 W) applied to the heating chip. As comparative example, a ceramic package type semiconductor device similar to that shown in FIG. 4 is prepared. The comparative device has a structure similar to that of the semiconductor device 30 shown in FIGS. 7 to 9, except that a through-hole formed in the metal cap has a circular shape (having a diameter of about 13 mm) smaller in size than the semiconductor chip, a heatsink plate is a CuW disk having a diameter of about 18 mm and including a circular projection fitting in the circular through-hole, and an Al heat dissipation fin having the same dimensions as those of the above-mentioned fin 35b is bonded to the CuW heatsink plate with a Pa-Ag solder by soldering. The above-mentioned Si semiconductor heating chip is mounted in the comparative package and a thermal resistance thereof measured. The measured data of the package is indicated by a curve B in FIG. 10. As can be seen from FIG. 10, the package according to the present invention has a better heat dissipation than that of the comparative package due to a surface area of the AlSi heatsink plate larger than that of the CuW heatsink plate under a condition that a specific gravity of AlSi is smaller than that of CuW, although the heat transfer rate (125.6 W/mK) of AlSi is lower than that (209.3 W/mK) of CuW.

It is possible to use CuMo alloy (Cu : Mo=15 wt % : 85 wt %) as the material of the heatsink plate 35a, since the CuMo can be joined to Al by friction welding. Also, Cu and AlSi may be used as the material of the heat dissipation fin 35b and can be joined to AlSi or CuMo by friction welding. It is also possible to produce the heatsink member by preparing a heatsink plate made of AlSi, CuW, CuMo, Al, Cu, Mo, AlN or SiC, coated with a Ni plating layer, preparing a heat dissipation fin made of AlSi, Al or Cu coated with a Ni plating layer, and bonding the heatsink plate and the fin with solder (e.g., Pb-Ag or Pb-Sn). Preferably, the Si content of the AlSi heatsink plate 35a is from 30 to 60 wt %. If the Si content is less than 30 wt %, the thermal expansion of such the AlSi approaches that of Al, and a difference between the thermal expansion of the AlSi and Si is increased. On the other hand, if the Si content is larger than 60 wt %, the heat transfer rate of the AlSi is reduced, to thereby lower the heat dissipation effect.

Figure 11:
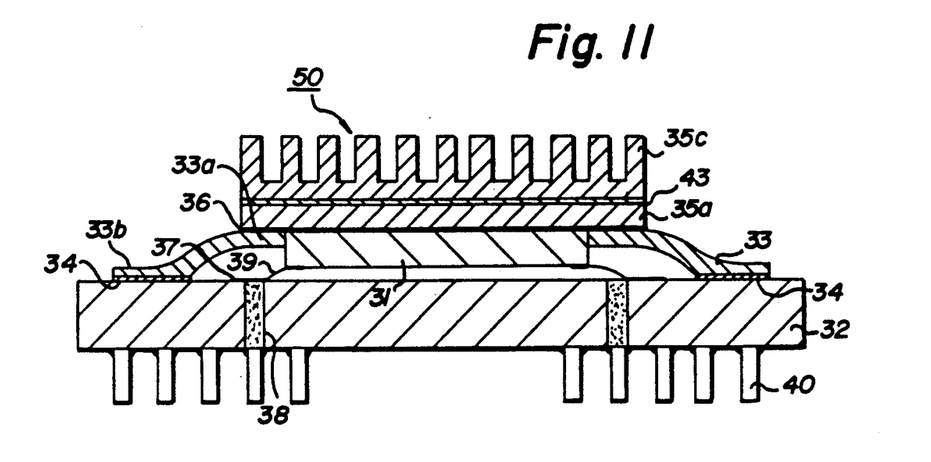
FIG. 11 is a sectional view of a ceramic package type semiconductor device with a comb-sectioned heat dissipation fin, according to a second embodiment of the present invention.

FIG. 11 shows another ceramic package type semiconductor device according to a second embodiment of the present invention. In this embodiment, the semiconductor device 50 has the same structure as that of the semiconductor device 30 according to the first embodiment, except that a comb-sectioned plate 35c of Al, AlSi or Cu is used instead of the heat dissipation fin 35b having disk fins and is bonded to the heatsink plate 35a with a solder plate 43 made of Pb-Sn and having the same size as the bottom of the comb-sectioned plate 35c. The heatsink plate 35a may be made of CuW, CuMo, Cu, Al, AlN or SiC and be coated with a metal layer (e.g., Ni plating layer) for soldering. Preferably the comb-sectioned plate is produced by extruding an Al ingot to form a long comb-sectioned bar and cutting it to predetermined dimensions.

Figure 12:
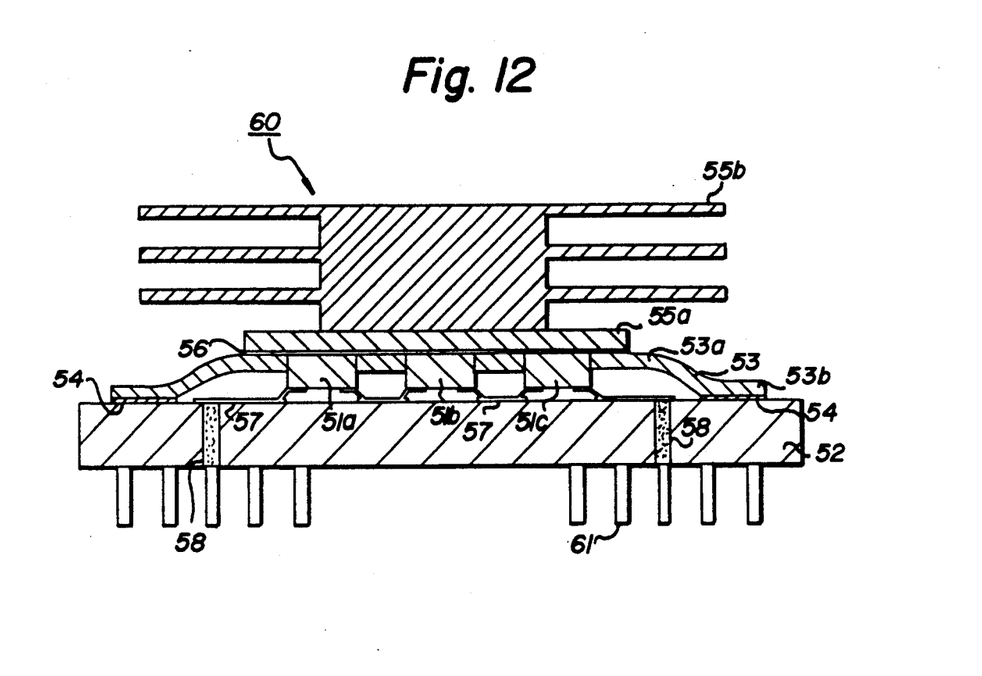
FIG. 12 is a sectional view of a ceramic package type semiconductor device with a plurality of semiconductor chips, according to a third embodiment of the present invention.

FIG. 12 shows another ceramic package type semiconductor device according to a third embodiment of the present invention. In this embodiment, the semiconductor device 60 has a structure similar to that of the device 30 according to the first embodiment, except that, instead of only one semiconductor chip, a plurality of (e.g., six) semiconductor chips 51a, 51b, 51c . . . are mounted in the package.

Figure 13:
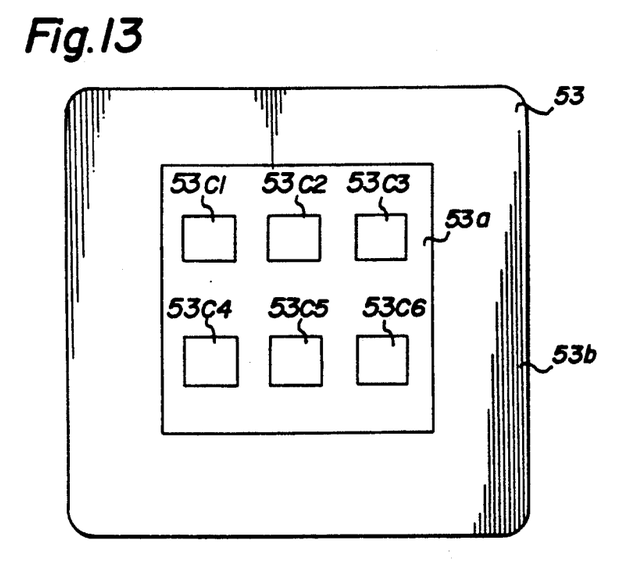
FIG. 13 is a plan view of a metal cap of the device of FIG. 12.

The semiconductor device 60 comprises six chips 51a, 51b, 51c . . . , an AlN ceramic substrate 52 with pins 61, interconnections 58 and wiring pattern layer 57, a Kovar metal cap 53, and a heatsink plate 55a and an Al heat dissipation fin 55b, which are joined by a friction welding method. The metal cap 53 includes a top flat portion 53a and a flange portion 53b and has six through-holes $53c_1$ to $53c_6$ at the top portion 53a, as shown in FIG. 13. Each of the through-holes $53c_1$ to $53c_6$ has a size corresponding to or slightly larger than an external size of each of the semiconductor chips 51a, 51b, 51c . . . When the metal cap 53 is placed on the substrate 52, the mounted chips 51a, 51b, 51c . . . fit (insert) in the through-holes $53c_1$ to $53c_6$, respectively, so that the top surface of the top flat portion 53a and bottom surfaces of the chips form a flat face in accordance with the present invention. After bonding the metal cap 53 to the ceramic substrate 52 with an Au-Sn solder frame 54, a Pb-Sn solder plate 56 having the same size as that of a flat bottom of the heatsink plate 55a is placed on the flat plane, and the heatsink member is then placed on the solder plate 56, to sandwich the solder plate 56 between the flat bottom of the heatsink plate 55a and the formed flat plane. Finally, the thus assembled device is heated to reflow (melt) the solder plate 56, to thereby bond the heatsink plate 55a to both the top flat portion 53a and the bottom surfaces of the chips 51a, 51b, 51c . . . , whereby a hermetic sealing is attained.

Figure 14:
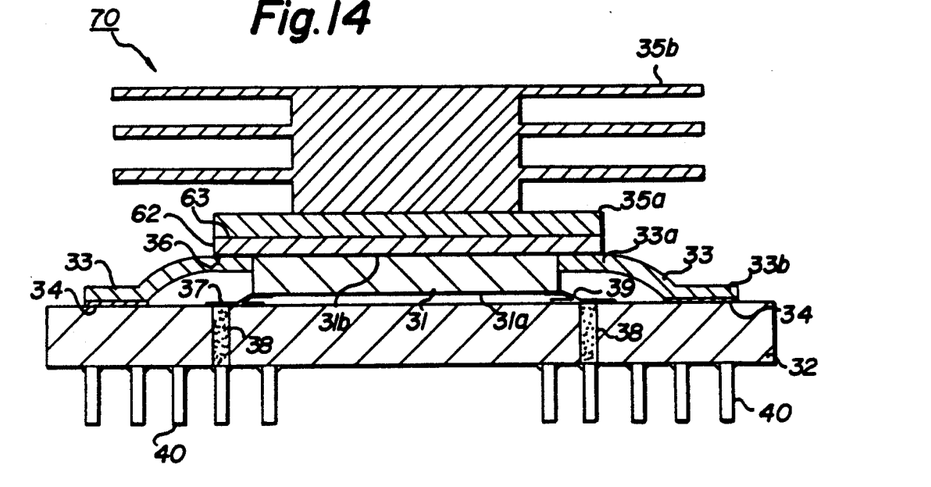
FIG. 14 is a sectional view of a ceramic package type semiconductor device with an additional buffer plate, according to a fourth embodiment of the present invention.

FIG. 14 shows still another ceramic package type semiconductor device according to a second embodiment of the present invention. In this embodiment, the semiconductor device 70 has the same structure as that of the semiconductor device 30 according to the first embodiment, except that a buffer plate 62 of CuW alloy or CuMo alloy is additionally set (bonded) on the bottom surface of the AlSi heatsink plate 35a through an additional solder plate (layer) 63. Since the thermal expansion of the CuW (Cu : W=10 wt % : 90 wt %) and CuMo (Cu : Mo=15 wt % : 85 wt %) is smaller than that of the AlSi (Al : Si=60 wt % : 40 wt %), and is closer to that of the Si semiconductor chip 31 than that of the AlSi, stress applied to the chip 31 is reduced. Preferable, the buffer plate 62 is bonded to the heatsink plate 35a with the solder plate 63 of Pb-Ag, before setting the buffer plate 62 on the Pb-Sn solder plate 36.

Figure 15:
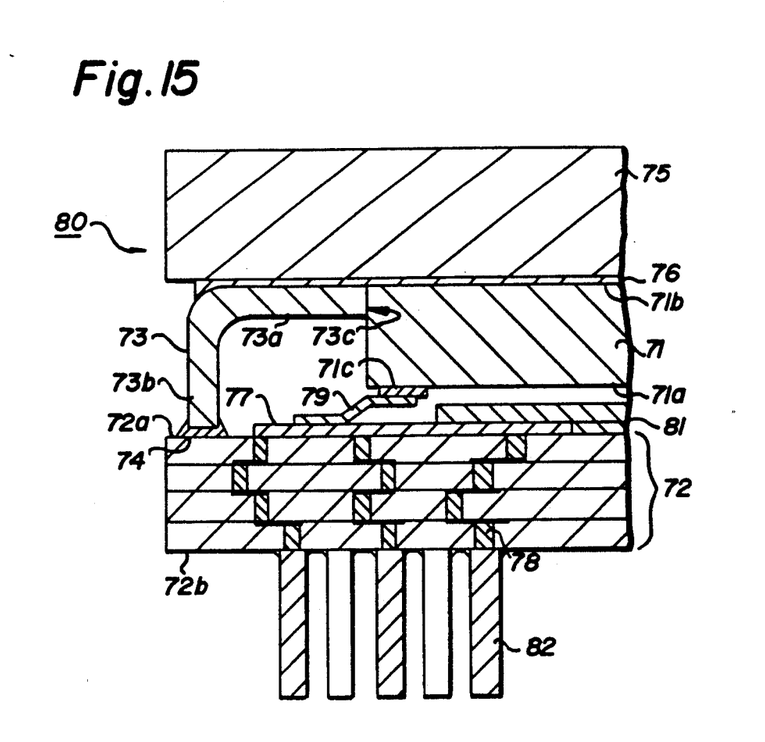
FIG. 15 is a sectional view of a ceramic package type semiconductor device with a heatsink plate without a heat dissipation fin, according to a fifth embodiment of the present invention.

FIG. 15 shows still another ceramic package type semiconductor device according to a fifth embodiment of the present invention. In this embodiment, for example, the semiconductor device 80 comprises a semiconductor chip 71 of a Si IC element, a ceramic substrate 72 of alumina ($Al_2O_3$) with pins 82 ($Al_2O_3$ PGA), a metal cap 73 of Kovar, and a heatsink plate 75 of AlN.

The alumina ceramic substrate 72 is produced by laminating alumina green sheets with printed wiring pattern layers, and sintering the laminated green sheets in accordance with a conventional process. The substrate 72 is provided with a wiring pattern layer 77 of a single conductive (W) layer, coated with a plating metal layer for soldering, on the top surface 72a thereof, and having interconnections 78 of refractory metal (W) therein. The pins 82 are fixed on a bottom surface 72b of the substrate 72 by soldering, to come into contact with the interconnections 78, respectively. The pattern layer 77 and the top surface 72b are coated with a polyimide layer 81, except for the contact regions and a soldering region for the metal cap 73.

The semiconductor chip 71 is the same type as the semiconductor chip 31 used in the first embodiment, is provided with solder bumps 71c on a top surface 71a thereof, and is coated with a metal multilayer for soldering on bottom surface 71b thereof. Microleads 79 are bonded to the bumps 71c, respectively, by a TAB processing method, and in the mounting process, are connected to the wiring pattern layer 77.

The metal cap 73 consists of a top flat portion 73 in which a through-hole 73c is formed, and a portion 73b perpendicular to the top surface 72a of the substrate 72. The metal cap 73 is produced and is coated with a plating layer for soldering in a manner similar to that mentioned in the first embodiment. The size of the through-hole 73c corresponds to (or is slightly larger than) an external size of the semiconductor chip 71. In this embodiment, since the metal cap 73 has no flange portion, the external size of the ceramic substrate 72 can be made smaller than that of the substrate 32 encompassing the flange portion 32b of the first embodiment.

The heatsink plate 75 is a flat AlN ceramic plate having dimensions equal or similar to those of the substrate 72, and is coated with a metal layer (e.g., Ni plating layer) for soldering. The heatsink plate 75 may be made of SiC, but preferably the ceramic heatsink plate 75 is coated with a metal lower layer formed by a sputtering method or a screen-printing and baking method and a metal upper layer formed on the lower layer by a plating method. For example, at least one of both flat surfaces of the AlN substrate is successively coated with a Ti layer having a thickness of about 0.1 $\mu$m, a Mo layer having a thickness of about 2 $\mu$m, and a Ni layer having a thickness of about 1 $\mu$m, by a sputtering method. The Ti layer increases the bonding strength of the following metal layer to the AlN substrate, the Mo layer brings the thermal expansion of the deposited metal layers as a whole close to that of the AlN substrate, since the thermal expansion of Mo is about 4 ppm/k, and the Ni layer increases the adhesion of a following Ni plating layer to the sputtered layers. The AlN substrate coated with the three sputtering layers is subjected to a heat treatment at 930° C. under a mixture gas of $H_2$ and $N_2$, to diffuse the Ti atoms, and then the coated AlN substrate is plated with the Ni layer having a thickness of 1 $\mu$m or more, is annealed at about 720° C. under a gas mixture of a reduction gas, such as $H_2$ and CO, and an inert gas, such as $N_2$ and $CO_2$, and is plated with an Au layer having a thickness of from 0.2 to 1.0 $\mu$m. When a Pb-Sn solder is used for bonding the coated AlN heatsink plate 75 to both the metal cap 73 and the semiconductor chip 71, the Au plating layer deposited on the Ni plating layer improves the flowability or wettability of the Pb-Sn solder melt. If the Au plating layer is thicker than 1.0 $\mu$m, an amount of Au dissolved in the Pb-Sn solder melt is increased, to raise the melting point of the Pb-Sn solder as a whole and to hinder the flowability of the solder. It is possible to adopt a screen-printed metal layer of W or Mo formed by screen-printing a metal paste on at least one of the AlN substrate surfaces and baking same, instead of the three sputtered metal layer.

A solder frame 74 having dimensions corresponding to those of the end surface of the perpendicular portion 73b, and the solder plate 76 having a size corresponding to that of the top flat portion 73a, are made of the same or a similar solder, e.g., Pb-Sn (Pb : Sn=80 to 90 wt % : 20 to 10 wt %).

The ceramic package type semiconductor device 80 (FIG. 15) is assembled in the following manner.

First, the semiconductor chip 71 is mounted on the alumina ceramic substrate 72 by bonding the microleads 79 to the wiring pattern layer 77, and then the solder frame 74 is put on the top surface 72a of the substrate 72; the metal cap 73 is positioned so that the chip 71 can be fitted into the through-hole 73c and the perpendicular portion 73b placed on the solder frame 74. As a result, the top surface of the metal cap 73 and the bottom surface 71b of the semiconductor chip 71 form a flat face. Thereafter, the solder plate 76 is placed on the flat face, and then the AlN heatsink plate 75 is put on the solder plate 76.

Finally, the thus assembled device is heated to reflow (melt) the Pb-Sn solder to solder (bond) the heatsink plate 75 to both the top flat portion 73a of the cap 73 and the bottom surface 71b of the chip 71, so that a highly reliable hermetic sealing is attained, and thus the semiconductor device 80 is completed. To further cool the semiconductor device 80, a water-cooled rubber bag can be brought into contact with an exposed top surface of the AlN ceramic heatsink plate 75 in a conductive cooling system. Furthermore, it is possible to bond the heat dissipation fin illustrated in FIGS. 9 and 10 with a bonding resin (e.g., epoxy resin).

It will be obvious that the present invention is not restricted to the above-mentioned embodiments and that many variations are possible for persons skilled in the art without departing from the scope of the invention. For example, where the solder plate 36 is made of the same solder material for the solder frame 34 or of a solder material having a melting point similar to that of another solder material for the solder frame 34 in FIGS. 7, 11 and 14, the reflowings of the solder frame 34 and the solder plate 36 are simultaneously carried out by a heat-treatment. It is possible to omit the heat dissipation fins 35b (FIGS. 7 and 14) and 35c (FIG. 11), and to adopt the heatsink member with the fins 35b and 35c instead of the heatsink plate 75 without fins (in FIG. 15).

We claim:

1. A method of assembling a semiconductor device of a hermetic sealing ceramic package type comprising the steps of:

mounting at least one semiconductor element on a ceramic substrate with a top face thereof facing downward and electrically connected to a wiring pattern layer of the ceramic substrate;

placing a solder frame on said ceramic substrate at a peripheral region of the substrate;

placing a metal cap having at least one through-hole corresponding to an external size of said semiconductor element, on said solder frame, to fit said semiconductor element into said through-hole and to form a flat plane with the top surface of said metal cap and the bottom surface of said semiconductor element;

heating the assembling device to solder said metal cap to said ceramic substrate;

placing a solder plate on said flat plane of the top surface of said metal cap and the bottom surface of said semiconductor element;

placing a plate portion of a heatsink member on said solder plate; and heating the assembling device to solder said plate portion to said metal cap and said semiconductor element, whereby a hermetic sealing of the semiconductor element is completed.

2. A method according to claim 1, wherein said solder frame has a melting point higher than that of said solder plate, and said heating step for said solder plate is carried out at a temperature higher than that of said heating step for said solder frame.

3. A method according to claim 2, wherein said solder frame is made of Au-Sn solder, and said solder plate is made of Pb-Sn solder.

4. A method according to claim 1, wherein said heatsink plate portion is made of a material selected from a group consisting of aluminum nitride ceramic, silicon carbide ceramic, Cu-W alloy, Cu-Mo alloy and AlSi alloy, and is coated with a metal layer for soldering.

5. A method according to claim 4, wherein said heatsink plate portion of aluminum nitride ceramic is coated with a metal lower layer formed by one of a sputtering method and a screen-printing method, and a metal upper layer is formed on the lower layer by a plating method.

6. A method according to claim 5, wherein said plating metal layer consists of a Ni plating layer having a thickness of 1.0 μm or more and an Au plating layer having a thickness of 0.2 to 1.0 μm and formed on the Ni plating layer.

7. A method according to claim 1, wherein said metal cap is made of an alloy selected from a group consisting of Fe-Ni-Co alloy and Fe-Ni alloy and is coated with a metal layer for soldering.

8. A method according to claim 7, wherein said metal cap is coated with a Ni plating layer having a thickness of 2.0 μm or more and then an Au plating layer having a thickness of 0.1 to 1.0 μm.

9. A method according to claim 1 further comprising, after said heating step for said solder plate, a step of bonding a heat dissipation fin portion to said heatsink plate portion with a resin.

10. A method according to claim 1, wherein said heatsink member consists of the plate portion and a heat dissipation fin portion fixed to said plate portion.

11. A method according to claim 10, wherein said fin portion is fixed to said plate portion with a solder.

12. A method according to claim 10, wherein said fin portion is fixed to said plate portion by a friction welding method.

13. A method of assembling a semiconductor device of a hermetic sealing ceramic package type comprising the steps of:

mounting at least one semiconductor element on a ceramic substrate with a top face thereof facing downward and electrically connected to a wiring pattern layer of the ceramic substrate;

placing a solder frame on said ceramic substrate at a peripheral region of the substrate;

placing a metal cap having at least one through-hole corresponding to an external size of said semiconductor element, on said solder frame, to fit said semiconductor element into said through-hole and to form a flat plane with the top surface of said metal cap and the bottom surface of said semiconductor element;

placing a solder plate made of the same solder as that of said solder frame on said flat plane of the top surface of said metal cap and the bottom surface of said semiconductor element;

placing a plate portion of a heatsink member on said solder plate; and heating the assembling device to solder said metal cap to said ceramic substrate and to simultaneously solder said plate portion to said metal cap and said semiconductor element, whereby a hermetic sealing of the semiconductor element is completed.

14. A method according to claim 13, wherein said heatsink plate portion is made of a material selected from a group consisting of aluminum nitride ceramic, silicon carbide ceramic, Cu-W alloy, Cu-Mo alloy, Cu, Al and Mo and is coated with metal layer for soldering.

15. A method according to claim 14, wherein said heatsink plate portion of aluminum nitride ceramic is coated with a metal lower layer formed by one of a sputtering method and a screen-printing and baking method, and a metal upper layer is formed on the lower layer by a plating method.

16. A method according to claim 15, wherein said plating metal layer consists of a Ni plating layer having a thickness of 1.0 μm or more and an Au plating layer having a thickness of 0.2 to 1.0 μm and formed on the Ni plating layer.

17. A method according to claim 13, wherein said metal cap is made of an alloy selected from a group consisting of Fe-Ni-Co alloy and Fe-Ni alloy and is coated with a metal layer for soldering.

18. A method according to claim 17, wherein said metal cap is coated with a Ni plating layer having a thickness of 2.0 μm or more and then an Au plating layer having a thickness of 0.1 to 1.0 μm.

19. A method according to claim 13 further comprising, after said heating step for said solder plate, a step of bonding a heat dissipation fin portion to said heatsink plate portion with a resin.

20. A method according to claim 13, wherein said heatsink member consists of the plate portion and a heat dissipation fin portion fixed to said plate portion.

21. A method according to claim 20, wherein said fin portion is fixed to said plate portion with a solder.

22. A method according to claim 20, wherein said fin portion is fixed to said plate portion by a friction welding method.

* * * * *